US012613442B2

(12) United States Patent
Lee et al.

(10) Patent No.: US 12,613,442 B2
(45) Date of Patent: *Apr. 28, 2026

(54) CONNECTOR, PRINTED CIRCUIT BOARD MOUNTING THE CONNECTOR, AND DISPLAY APPARATUS INCLUDING THE SAME

(71) Applicant: SAMSUNG ELECTRONICS CO., LTD., Gyeonggi-do (KR)

(72) Inventors: Youngmin Lee, Suwon-si (KR); Jaewoo Kim, Suwon-si (KR); Seungyong Shin, Suwon-si (KR); Hyukjun Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 19/069,504

(22) Filed: Mar. 4, 2025

(65) Prior Publication Data

US 2025/0199359 A1     Jun. 19, 2025

Related U.S. Application Data

(63) Continuation of application No. 18/643,399, filed on Apr. 23, 2024, now Pat. No. 12,282,225, which is a
(Continued)

(51) Int. Cl.
| | |
|---|---|
| *G02F 1/1335* | (2006.01) |
| *G02F 1/13357* | (2006.01) |
| *H05K 1/182* | (2026.01) |

(52) U.S. Cl.
CPC .. *G02F 1/133612* (2021.01); *G02F 1/133608* (2013.01); *H05K 1/182* (2013.01);
(Continued)

(58) Field of Classification Search
CPC ........ G02F 1/133612; G02F 1/133608; H05K 1/182
See application file for complete search history.

(56) References Cited

U.S. PATENT DOCUMENTS

| | | | |
|---|---|---|---|
| 7,507,107 B2 | 3/2009 | Tuerschmann et al. | |
| 9,207,492 B2 * | 12/2015 | Park ................. | G02F 1/133608 |

(Continued)

FOREIGN PATENT DOCUMENTS

| | | |
|---|---|---|
| CN | 109257872 A | 1/2019 |
| CN | 112186379 A | 1/2021 |

(Continued)

OTHER PUBLICATIONS

International Search Report (PCT/ISA/210) issued May 12, 2023 by the International Searching Authority in counterpart International Patent Application No. PCT/KR2023/001399.
(Continued)

*Primary Examiner* — Christopher E Dunay
(74) *Attorney, Agent, or Firm* — Sughrue Mion, PLLC

(57) ABSTRACT

A display apparatus including: a display panel; an outer case coupled to an outer side of the inner case; a printed circuit board defining an upper surface, a lower surface, and a through-hole; a plurality of light sources configured to emit light to the display panel; and a connector inserted in the through-hole. The connector includes: a connector body inserted in the through-hole and defining a first side surface and a second side surface; and a plurality of connector terminals on the upper surface and configured to electrically connect the connector body to a portion of the printed circuit board. A first surface portion of the upper surface is adjacent to the first side surface, a second surface portion of the upper surface is adjacent to the second side surface, and the plurality of connector terminals are configured to electrically
(Continued)

connect the first surface portion to the second surface portion.

7 Claims, 11 Drawing Sheets

Related U.S. Application Data continuation of application No. 18/112,270, filed on Feb. 21, 2023, now Pat. No. 12,001,101, which is a continuation of application No. PCT/KR2023/001399, filed on Jan. 31, 2023.

(52) U.S. Cl.
     CPC ................. *G02F 1/133603* (2013.01); *H05K 2201/09072* (2013.01); *H05K 2201/10106* (2013.01); *H05K 2201/10189* (2013.01)

(56) References Cited

U.S. PATENT DOCUMENTS

| | | | |
|---|---|---|---|
| 9,482,810 B2 | 11/2016 | Choi et al. | |
| 9,857,629 B2 | 1/2018 | Ishizuka | |
| 10,067,385 B2 | 9/2018 | Jeon et al. | |
| 11,088,066 B2 | 8/2021 | Saaski et al. | |
| 2009/0002595 A1* | 1/2009 | Kim | G02F 1/133308 |
| | | | 349/61 |
| 2009/0207125 A1 | 8/2009 | Park et al. | |
| 2009/0262276 A1* | 10/2009 | Jeong | G02B 6/0085 |
| | | | 349/116 |
| 2011/0111608 A1 | 5/2011 | Chen et al. | |
| 2012/0262643 A1* | 10/2012 | Kweon | G02B 6/0073 |
| | | | 362/249.02 |
| 2018/0356686 A1* | 12/2018 | Yeh | G02F 1/133608 |
| 2020/0161519 A1* | 5/2020 | Deckers | H01L 23/15 |
| 2021/0225929 A1 | 7/2021 | Cho et al. | |
| 2023/0194922 A1 | 6/2023 | Kim | |

FOREIGN PATENT DOCUMENTS

| | | |
|---|---|---|
| CN | 214175596 U | 9/2021 |
| JP | 6136501 B2 | 5/2017 |
| JP | 2021-524152 A | 9/2021 |
| KR | 10-2009-0111505 A | 10/2009 |
| KR | 10-2012-0051856 A | 5/2012 |
| KR | 10-2012-0063153 A | 6/2012 |
| KR | 10-1419459 B1 | 7/2014 |
| KR | 10-2015-0002046 A | 1/2015 |
| KR | 10-2016-0083175 A | 7/2016 |
| KR | 10-2017-0062323 A | 6/2017 |
| KR | 10-2296788 B1 | 9/2021 |
| KR | 10-2330105 B1 | 11/2021 |

OTHER PUBLICATIONS

Written Opinion (PCT/ISA/210) issued May 12, 2023 by the International Searching Authority in counterpart International Patent Application No. PCT/KR2023/001399.
Communication dated Nov. 27, 2024, issued by the European Patent Office in counterpart European Application No. 23753048.0.
U.S. Appl. No. 18/643,399, filed Apr. 23, 2024.
U.S. Appl. No. 18/112,270, filed Feb. 21, 2023.

* cited by examiner

UP

DOWN

FORWARD

BACKWARD

CONNECTOR, PRINTED CIRCUIT BOARD MOUNTING THE CONNECTOR, AND DISPLAY APPARATUS INCLUDING THE SAME

CROSS-REFERENCE TO RELATED APPLICATION(S)

This application is a continuation application of U.S. patent application Ser. No. 18/643,399, filed on Apr. 23, 2024, which is a continuation application of U.S. patent application Ser. No. 18/112,270, filed on Feb. 21, 2023, which is a by-pass continuation application of International Application No. PCT/KR2023/001399, filed on Jan. 31, 2023, which claims priority to Korean Patent Applications No. 10-2022-0016786, filed on Feb. 9, 2022, and No. 10-2022-0165218, filed on Nov. 30, 2022, both in the Korean Intellectual Property Office, the disclosures of which are incorporated by reference herein in their entireties.

BACKGROUND

1. Field

The disclosure relates to a connector mounted on an upper surface of a printed circuit board to provide electrical connections for the printed circuit board, and a display apparatus including the same. More particularly, the disclosure relates to a connector which provides more convenient electrical connection between components both on and off the printed circuit board in the apparatus.

2. Description of Related Art

Generally, a display apparatus is a kind of an output apparatus that converts obtained or stored electrical information into visual information and displays the visual information to a user. The display apparatus may be used in various fields, such as home or workplace.

The display apparatus includes a monitor apparatus, which can be connected to a variety of sources of visual information. Such sources may include, but are not limited to a personal computer or a server computer, a portable computer device, a navigation terminal device, a general television apparatus, an Internet Protocol television (IPTV), a portable terminal device, such as a smart phone, a tablet PC, a personal digital assistant (PDA) or a cellular phone, various display apparatuses used to reproduce images, such as advertisements or movies in an industrial field, and various kinds of audio/video systems.

The display apparatus includes a light source module to convert electrical information into visual information, and the light source module includes a plurality of light sources configured to independently emit light.

Each of the plurality of light sources includes a light emitting diode (LED) or an organic light emitting diode (OLED). For example, the LED or the OLED may be mounted to a printed circuit board through surface mount technology (SMT).

In the related art, the plurality of light sources, and other components, are mounted on an upper surface of the printed circuit board. After the light sources and components are mounted on the upper surface of the printed circuit board, a connector providing an electrical connection between the upper and lower surfaces of the printed circuit board is mounted on the lower surface of the printed circuit board.

In the related art, the process of mounting the connector to the lower surface of the printed circuit board is performed after the process of the mounting the plurality of light sources and components to the upper surface of the printed circuit board. Accordingly, due to the double process, a process time may be increased and a cost thereof may also be increased.

SUMMARY

Provided are a connector capable of providing an electrical connection between an upper surface and a lower surface of a printed circuit board by being mounted on the upper surface of the printed circuit board, and a display apparatus including the same.

Additionally, provided are a connector capable of electrically connecting portions of a printed circuit board adjacent to a first side surface of the connector to portions of the printed circuit board adjacent to a second side surface of the connector through a plurality of terminals mounted on an upper surface of the printed circuit board, and a display apparatus including the same.

Further, provided are a connector capable of detachably coupling to a wire for electrically connecting a printed circuit board to other components of a display apparatus.

Additional aspects will be set forth in part in the description which follows and, in part, will be apparent from the description, or may be learned by practice of the presented embodiments.

In accordance with an aspect of the disclosure, a display apparatus includes: a display panel; an outer case coupled to an outer side of the inner case to form an exterior; a printed circuit board defining an upper surface, a lower surface opposite the upper surface, and a through-hole; a plurality of light sources mounted on the upper surface of the printed circuit board and configured to emit light to the display panel; and a connector provided on the upper surface of the printed circuit board and inserted in the through-hole. The connector includes: a connector body inserted in the through-hole of the printed circuit board, the connector body defining a first side surface and a second side surface opposite to the first side surface; and a plurality of connector terminals disposed on the upper surface of the printed circuit board, the plurality of connector terminals being configured to electrically connect the connector body to a portion of the printed circuit board. A first surface portion of the upper surface of the printed circuit board is defined adjacent to the first side surface of the connector body, a second surface portion of the upper surface of the printed circuit board is defined adjacent to the second side surface, and the plurality of connector terminals are configured to electrically connect the first surface portion of the printed circuit board to the second surface portion of the printed circuit board.

The first surface portion of the upper surface of the printed circuit board may be defined adjacent to the first side surface of the connector body. The second surface portion of the upper surface of the printed circuit board may be defined adjacent to the second side surface The plurality of connector terminals may include a first connector terminal configured to electrically connect the connector body to the first surface portion, and a second connector terminal configured to electrically connect the connector body to the second surface portion of the printed circuit board.

The connector body may further include a connecting member protruding past the lower surface of the printed circuit board through the through-hole.

The display apparatus may further include: a bottom chassis; and a rear cover adjacent to the lower surface of the printed circuit board, the printed circuit board being assembled on the rear cover.

The display apparatus may further include: a power assembly provided on the rear cover and configured to supply power to the plurality of light sources; and a control assembly provided on the rear cover and configured to control an operation of the plurality of light sources.

The power assembly and the control assembly may be electrically connected to the connecting member through a wire.

The display apparatus may further include: a power assembly configured to supply power to the plurality of light sources; a control assembly configured to control an operation of the plurality of light sources; and an auxiliary connector detachably coupled to a lower portion of a connector body of the connector protruding past the lower surface of the printed circuit board through the through-hole The power assembly and the control assembly may be electrically connected to the auxiliary connector through a wire to thereby electrically connect to the connector body.

BRIEF DESCRIPTION OF THE DRAWINGS

The above and other aspects, features, and advantages of certain embodiments of the present disclosure will become more apparent from the following description taken in conjunction with the accompanying drawings, in which.

DETAILED DESCRIPTION

Figure 1:
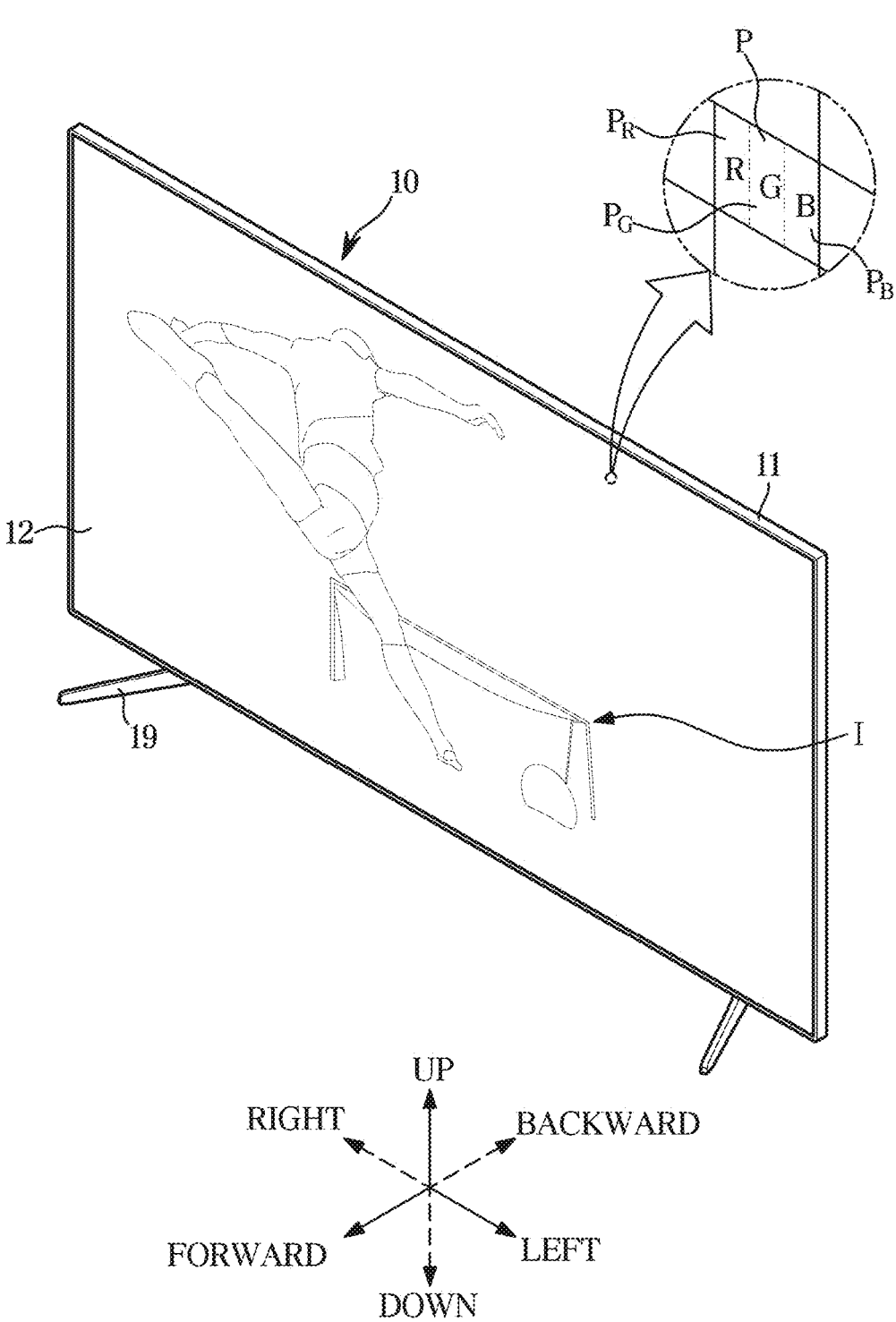
FIG. 1 is a view of an appearance of a display apparatus, according to an embodiment of the disclosure.

Embodiments described in the disclosure and configurations shown in the drawings are merely examples of the embodiments of the disclosure, and may be modified in various different ways at the time of filing of the present application to replace the embodiments and drawings of the disclosure.

In addition, the same reference numerals or signs shown in the drawings of the disclosure indicate elements or components performing substantially the same function.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms. These terms are only used to distinguish one element from another element. For example, without departing from the scope of the disclosure, a first element may be termed as a second element, and a second element may be termed as a first element. The term of "and/or" includes a plurality of combinations of relevant items or any one item among a plurality of relevant items.

Terms such as "unit", "module", "member", and "block" may be embodied as hardware or software. According to embodiments, a plurality of "unit", "module", "member", and "block" may be implemented as a single component or a single "unit", "module", "member", and "block" may include a plurality of components.

It will be understood that when an element is referred to as being "connected" another element, it can be directly or indirectly connected to the other element, wherein the indirect connection includes "connection via a wireless communication network".

Also, when a part "includes" or "comprises" an element, unless there is a particular description contrary thereto, the part may further include other elements, not excluding the other elements.

Throughout the description, when a member is "on" another member, this includes not only when the member is in contact with the other member, but also when there is another member between the two members.

An orientation guide (that is, a "compass") is provided in various drawings. This guide is intended to provide a consistent sense of direction between drawings, such that the orientation of elements shown in different drawings relative to each other can be more easily determined. It is noted that the terms for the directions are selected for convenience, and are not limiting as to the orientation of the illustrated elements relative to elements which are not part of the illustrated system. As but one example, the indication of an "UP" direction in a drawing does not require that a display shown in the drawing be installed to orient the indicated side of the display upward relative to the ground; if the display is installed in a portrait orientation, rather than a landscape orientation shown in the drawing, the "UP" direction indicated in the drawings might be horizontal relative to the ground. It is additionally noted that the use of, for example, "upper" to describe certain elements herein does not necessarily indicate a correspondence to the "UP" direction indicated by the guide, and likewise for similar adjectives, as will become clear.

Reference will now be made in detail to embodiments of the disclosure, examples of which are illustrated in the accompanying drawings.

FIG. 1 is a view illustrating an appearance of a display apparatus according to an embodiment of the disclosure.

A display apparatus 10 is a device that processes an image signal received from the outside and visually displays the processed image. Hereinafter a case in which the display apparatus 10 is a television is exemplified, but the disclosure is not limited thereto. For example, the display apparatus 10 may be implemented in various forms, such as a monitor, a portable multimedia device, and a portable communication device, among other possibilities, and the display apparatus 10 is not limited in its shape as long as the display apparatus is capable of visually displaying an image.

As an example, the display apparatus 10 may be a large format display (LFD) installed outdoors, such as a roof of a building or a bus stop. "Outdoors" is not limited to the outside of a building, and thus the display apparatus 10 according to an embodiment may be installed in any places as long as the display apparatus is accessible by a large number of people, even indoors, such as subway stations, shopping malls, movie theaters, companies, and stores. Also, the display apparatus 10 is not limited to the examples of an LFD or an "outdoors" installation, but may be of any size and any location of installation.

The display apparatus 10 may receive content data including video data and audio data from various content sources and output video and audio corresponding to the video data and the audio data. For example, the display apparatus 10 may receive content data through a broadcast reception antenna or cable, receive content data from a content playback device, or receive content data from a content providing server of a content provider.

As shown in the embodiment illustrated in FIG. 1, the display apparatus 10 includes a body 11, a screen 12 provided to display an image I, and a supporter 19 provided below the body 11 to support the body 11.

The body 11 may form an appearance of the display apparatus 10, and the body 11 may include a component configured to allow the display apparatus 10 to display the image I and to perform various functions. Although the body 11 shown in FIG. 1 is in the form of a flat plate, the shape of the body 11 is not limited thereto. For example, the body 11 may have a curved plate shape.

The screen 12 may be formed on a front surface of the body 11, and display the image I. For example, the screen 12 may display a still image or a moving image. Further, the screen 12 may display a two-dimensional plane image or a three-dimensional image using binocular parallax of the user.

A plurality of pixels P may be formed on the screen 12 and the image I displayed on the screen 12 may be formed by a combination of the lights emitted from the plurality of pixels P. For example, the image I may be formed on the screen 12 by combining light emitted from the plurality of pixels P as a mosaic.

Each of the plurality of pixels P may emit light at different brightnesses and in different colors. In order to emit different brightnesses of light, each of the plurality of pixels P may include a self-luminous panel (for example, a light emitting diode panel) configured to directly emit light, or a non-self-luminous panel (for example, a display panel) configured to transmit or block light emitted by a light source apparatus.

In order to emit light in various colors, the plurality of pixels P may include sub-pixels $P_R$, $P_G$, and $P_B$, respectively.

The sub-pixels $P_R$, $P_G$, and $P_B$ may include a red sub pixel $P_R$ emitting red light, a green sub pixel $P_G$ emitting green light, and a blue sub pixel $P_B$ emitting blue light. For example, the red light may represent a light beam having a wavelength of approximately 620 nm (nanometers, one billionth of a meter) to 750 nm, the green light may represent a light beam having a wavelength of approximately 495 nm to 570 nm, and the blue light may represent a light beam having a wavelength of approximately 450 nm to 495 nm.

By combining the red light of the red sub pixel $P_R$, the green light of the green sub pixel $P_G$ and the blue light of the blue sub pixel $P_B$, each of the plurality of pixels P may emit light at different brightnesses and in different colors.

Figure 2:
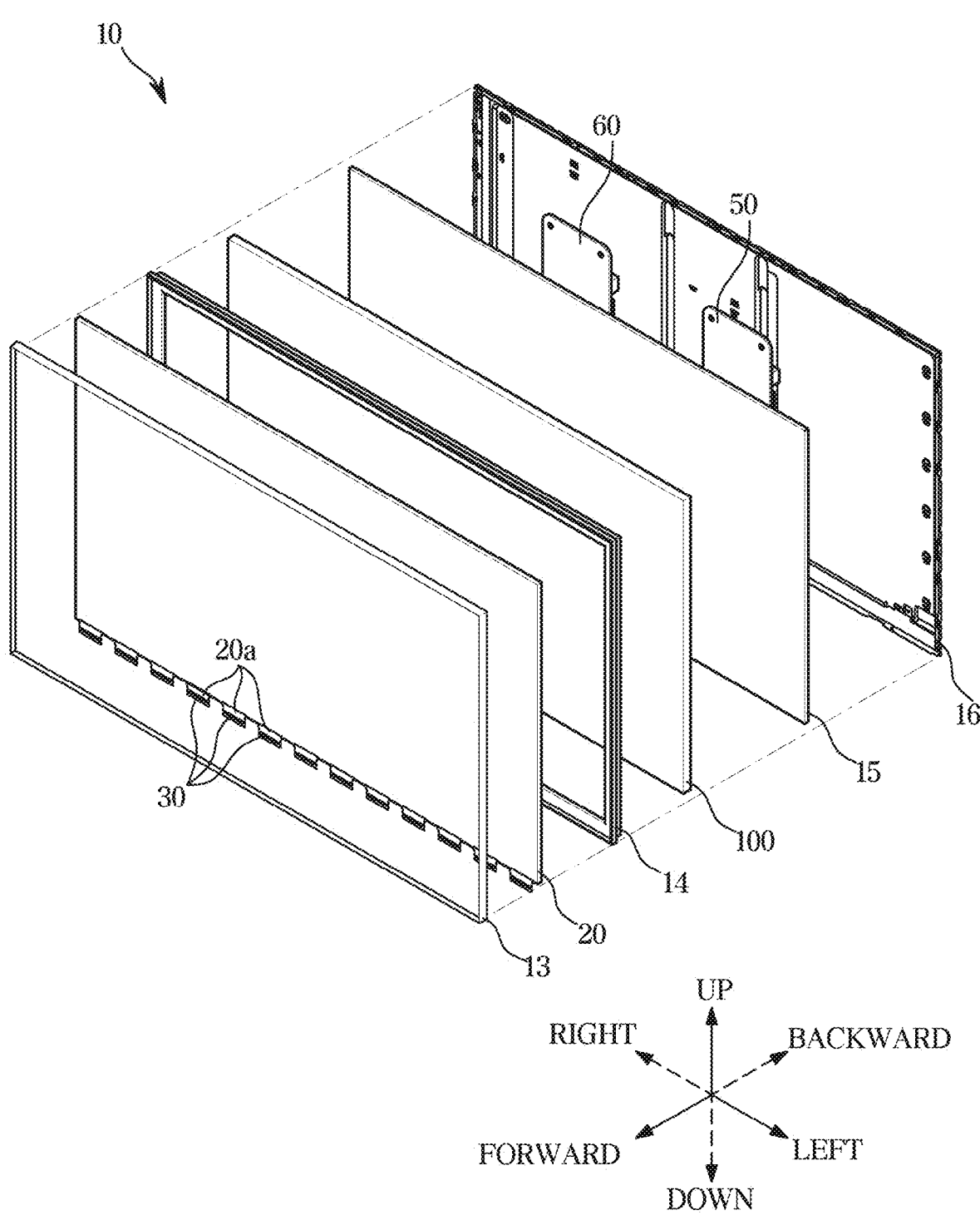
FIG. 2 is an exploded view of the display apparatus shown in FIG. 1, according to an embodiment of the disclosure.

FIG. 2 is an exploded view of the display apparatus 10 shown in FIG. 1, according to an embodiment of the disclosure.

As shown in the embodiment illustrated in FIG. 2, various components configured to generate the image I on the screen S may be provided inside the body 11 (with reference to FIG. 1).

For example, the body 11 shown in FIG. 1 may include a light source apparatus 100 that is a surface light source, a display panel 20 configured to block or transmit light emitted from the light source apparatus 100, a control assembly 50 configured to control an operation of the light source apparatus 100 and the display panel 20, and a power assembly 60 configured to supply power to the light source apparatus 100 and the display panel 20. Further, the body 11 may include a bezel 13, a frame middle mold 14, a bottom chassis 15 and a rear cover 16 which are provided to support and fix the display panel 20, the light source apparatus 100, the control assembly 50 and the power assembly 60.

The light source apparatus 100 may include a point light source configured to emit monochromatic light or white light. The light source apparatus 100 may refract, reflect, and scatter light in order to convert light, which is emitted from the point light source, into uniform surface light. For example, the light source apparatus 100 may include a plurality of light sources configured to emit monochromatic light or white light, a diffuser plate configured to diffuse light incident from the plurality of light sources, a reflective sheet configured to reflect light emitted from the plurality of light sources and a rear surface of the diffuser plate, and an optical sheet configured to refract and scatter light emitted from a front surface of the diffuser plate.

As mentioned above, the light source apparatus 100 may refract, reflect, and scatter light emitted from the light source, thereby emitting uniform surface light toward the front side.

Figure 3:
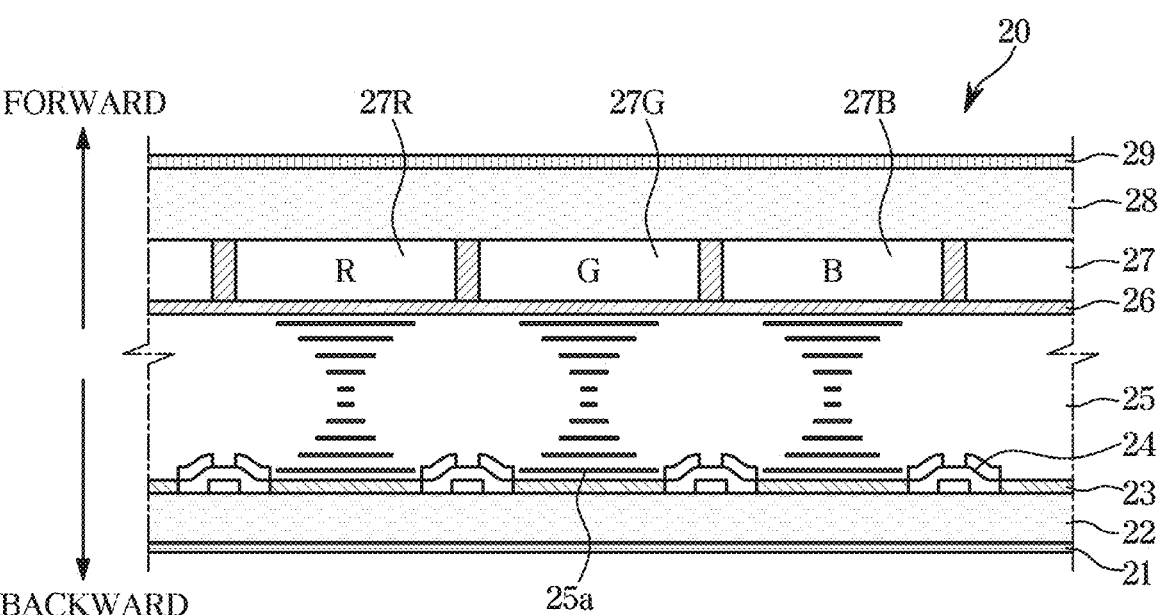
FIG. 3 is a side sectional view of a display panel of the display apparatus shown in FIG. 2, according to an embodiment of the disclosure.

FIG. 3 is a side sectional view of the display panel 20 of the display apparatus 10 shown in FIG. 2, according to an embodiment of the disclosure.

The display panel 20 may be provided in front of the light source apparatus 100, and may block or transmit light emitted from the light source apparatus 100 to form the image I.

A front surface of the display panel 20 may form the screen 12 of the display apparatus 10 described above with reference to FIG. 1, and the display panel 20 may form the plurality of pixels P. The plurality of pixels P may independently block or transmit light from the light source apparatus 100, and the light transmitted through the plurality of pixels P may form the image I displayed on the screen 12.

For example, as shown in the embodiment illustrated in FIG. 3, the display panel 20 may include a first polarizing film 21, a first transparent substrate 22, a pixel electrode 23, a thin film transistor 24, a liquid crystal layer 25, a common electrode 26, a color filter 27, a second transparent substrate 28, and a second polarizing film 29.

The first transparent substrate 22 and the second transparent substrate 28 may fixedly support the pixel electrode 23, the thin film transistor 24, the liquid crystal layer 25, the common electrode 26, and the color filter 27. The first and second transparent substrates 22 and 28 may be formed of tempered glass or transparent resin.

The first polarizing film 21 and the second polarizing film 29 may be provided on the outside of the first and second transparent substrates 22 and 28.

Each of the first polarizing film 21 and the second polarizing film 29 may transmit a specific light beam and block other light beams. For example, the first polarizing film 21 may transmit a light beam having a magnetic field vibrating in a first direction and block other light beams. In addition, the second polarizing film 29 may transmit a light beam having a magnetic field vibrating in a second direction and block other light beams. In this case, the first direction and the second direction may be perpendicular to each other. Accordingly, a polarization direction of the light transmitted through the first polarizing film 21 and a vibration direction of the light transmitted through the second polarizing film 29 may be perpendicular to each other. As a result, in general, light may not pass through the first polarizing film 21 and the second polarizing film 29 at the same time.

The color filter 27 may be provided on the inner side of the second transparent substrate 28.

The color filter 27 may include a red filter 27R transmitting red light, a green filter 27G transmitting green light, and a blue filter 27B transmitting blue light. The red filter 27R, the green filter 27G, and the blue filter 27B may be disposed parallel to each other. A region, in which the color filter 27 is formed, may correspond to the pixel P described above. A region, in which the red filter 27R is formed, may correspond to the red sub-pixel $P_R$, a region, in which the green filter 27G is formed, may correspond to the green sub-pixel $P_G$, and a region, in which the blue filter 27B is formed, may correspond to the blue sub-pixel $P_B$.

The pixel electrode 23 may be provided on the inner side of the first transparent substrate 22, and the common electrode 26 may be provided on the inner side of the second transparent substrate 28.

The pixel electrode 23 and the common electrode 26 may be formed of a metal material through which electricity is conducted, and the pixel electrode 23 and the common electrode 26 may generate an electric field to change the arrangement of liquid crystal molecules 25a forming the liquid crystal layer 25 to be described below.

The pixel electrode 23 and the common electrode 26 may be formed of a transparent material, and may transmit light incident from the outside. For example, the pixel electrode 23 and the common electrode 26 may include indium tin oxide (ITO), indium zinc oxide (IZO), silver nanowire (Ag nanowire), carbon nanotube (CNT), graphene, poly(3,4-ethylenedioxythiophene) (PEDOT), or a combination thereof, among other materials.

The thin film transistor (TFT) 24 may be provided on the inner side of the first transparent substrate 22.

The TFT 24 may transmit or block a current flowing through the pixel electrode 23. For example, an electric field may be formed or removed between the pixel electrode 23 and the common electrode 26 in response to turning on (closing) or turning off (opening) of the TFT 24.

The TFT 24 may be formed of poly-silicon, and may be formed by semiconductor processes, such as lithography, deposition, and ion implantation, among others.

The liquid crystal layer 25 may be formed between the pixel electrode 23 and the common electrode 26, and the liquid crystal layer 25 may be filled with the liquid crystal molecules 25a.

Liquid crystals represent an intermediate state between a solid (crystal) and a liquid. Most of the liquid crystal materials are organic compounds, and the molecular shape is in the shape of an elongated rod, and the orientation of molecules is in an irregular state in one direction, but in a regular state in other directions. As a result, the liquid crystal has both the fluidity of the liquid and the optical anisotropy of the crystal (solid).

In addition, liquid crystals also exhibit optical properties according to changes in an electric field. For example, in the liquid crystal, the orientation of molecules forming the liquid crystal may change according to a change in an electric field. In response to an electric field being generated in the liquid crystal layer 25, the liquid crystal molecules 25a of the liquid crystal layer 25 may be disposed along the direction of the electric field. In response to the electric field not being generated in the liquid crystal layer 25, the liquid crystal molecules 25a may be disposed irregularly or disposed along an alignment layer (not shown). As a result, the optical properties of the liquid crystal layer 25 may vary depending on the presence or absence of the electric field passing through the liquid crystal layer 25.

Referring back to FIG. 2, a cable 20a configured to transmit image data to the display panel 20, and a display driver integrated circuit (DDI) (hereinafter referred to as 'driver IC') 30 configured to process digital image data and output an analog image signal, may be provided at one side of the display panel 20.

The cable 20a may electrically connect the control assembly 50 and/or the power assembly 60 to the driver IC 30, and may also electrically connect the driver IC 30 to the display panel 20. The cable 20a may include a flexible flat cable or a film cable that is bendable.

The driver IC 30 may receive image data and power from the control assembly 50 and/or the power assembly 60 through the cable 20a. The driver IC 30 may transmit the image data and driving current to the display panel 20 through the cable 20a.

In addition, the cable 20a and the driver IC 30 may be integrally implemented as a film cable, a chip on film (COF), or a tape carrier package (TCP). In other words, the driver IC 30 may be arranged on the cable 20a. However, the disclosure is not limited thereto, and the driver IC 30 may be arranged on the display panel 20.

The control assembly 50 may include a control circuit configured to control an operation of the display panel 20 and the light source apparatus 100. The control circuit may process image data received from an external content source, transmit the image data to the display panel 20, and transmit dimming data to the light source apparatus 100.

The power assembly 60 may supply power to the display panel 20 and the light source apparatus 100 to allow the light source apparatus 100 to output surface light and to allow the display panel 20 to block or transmit the light of the light source apparatus 100.

The control assembly 50 and the power assembly 60 may be implemented as a printed circuit board and various circuits mounted on the printed circuit board. For example, the power circuit may include a capacitor, a coil, a resistance element, a processor, and a power circuit board on which the capacitor, the coil, the resistance element, and the processor are mounted. Further, the control circuit may include a memory, a processor, and a control circuit board on which the memory and the processor are mounted.

Figure 4:
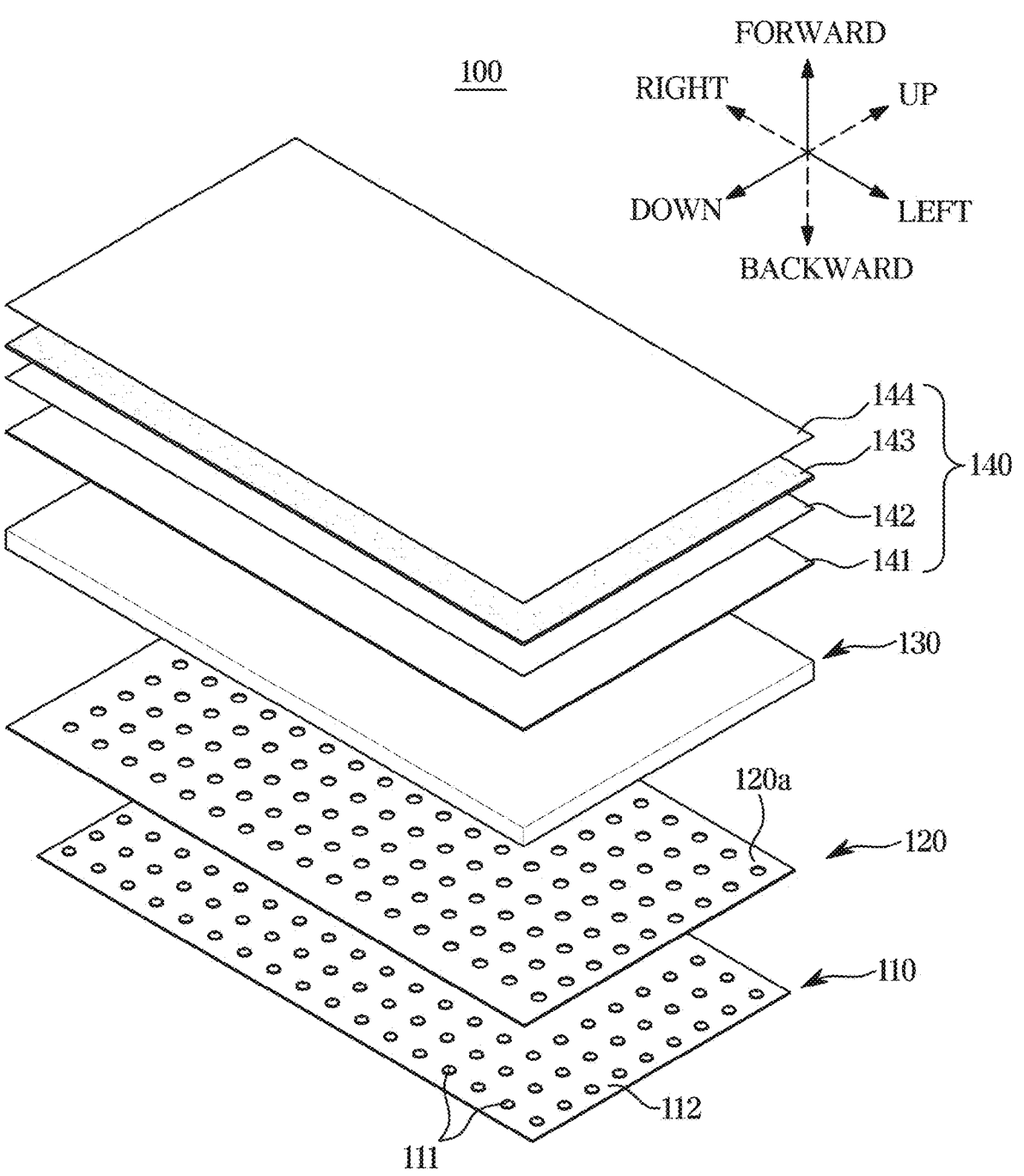
FIG. 4 is an exploded view of a light source apparatus shown in FIG. 2, according to an embodiment of the disclosure.
Figure 5:
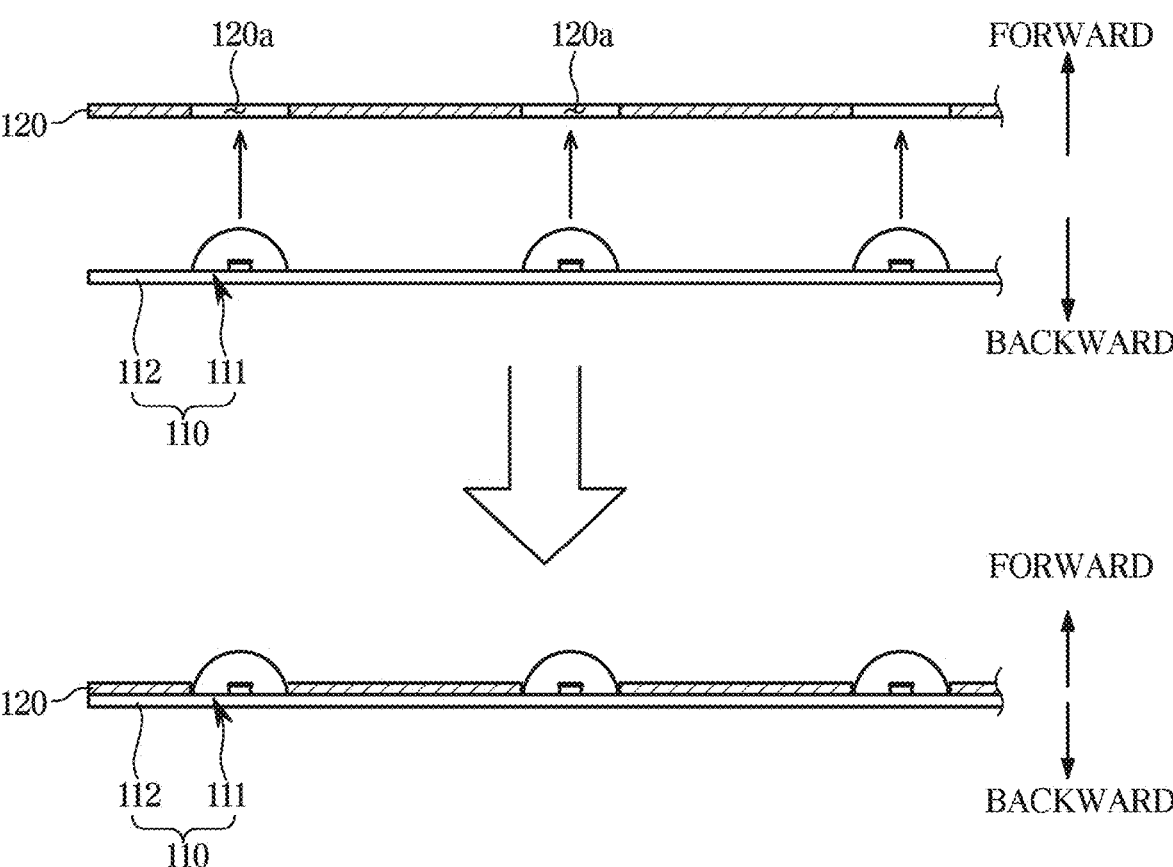
FIG. 5 is a view illustrating coupling between a light source module and a reflective sheet included in the light source apparatus shown in FIG. 4, according to an embodiment of the disclosure.

FIG. 4 is an exploded view of the light source apparatus 100 shown in FIG. 2, according to an embodiment of the disclosure. FIG. 5 is a view illustrating coupling between a light source module and a reflective sheet included in the light source apparatus 100 shown in FIG. 4, according to an embodiment of the disclosure.

The light source apparatus 100 may include a light source module 110 configured to generate light, a reflective sheet 120 configured to reflect light, a diffuser plate 130 configured to uniformly diffuse light, and an optical sheet 140 configured to improve a luminance of light that is emitted.

The light source module 110 may be arranged at a rear of the display panel 20. The light source module 110 may include a plurality of light sources 111 configured to emit light, and a printed circuit board (PCB) 112 provided to support and/or fix the plurality of light sources 111. The PCB 112 may define an upper surface thereof, and a lower surface opposite the upper surface. The plurality of light sources 111 may be mounted on the upper surface of the PCB 112. A plurality of components (not shown) may also be mounted on the upper surface of the PCB 112.

The plurality of light sources 111 may be disposed in a predetermined pattern to allow light to be emitted with uniform luminance. The plurality of light sources 111 may be disposed in such a way that a distance between one light source and light sources adjacent thereto is the same.

For example, as shown in the embodiment illustrated in FIG. 4, the plurality of light sources 111 may be disposed in rows and columns. Accordingly, the plurality of light sources may be disposed such that an approximate square is formed by four adjacent light sources. In addition, any one light source may be disposed adjacent to four light sources, and a distance between one light source and four adjacent light sources may be approximately the same.

Alternatively, in an undepicted embodiment, the plurality of light sources may be disposed in a plurality of rows, and a light source belonging to each row may be disposed at the center of two light sources belonging to an adjacent row. Accordingly, the plurality of light sources may be disposed such that an approximately equilateral triangle is formed by three adjacent light sources. In this case, one light source may be disposed adjacent to six light sources, and a distance between one light source and six adjacent light sources may be approximately the same.

However, the pattern in which the plurality of light sources 111 is disposed is not limited to the patterns described above, and the plurality of light sources 111 may be disposed in various other patterns to allow light to be emitted with uniform luminance.

Each light source 111 may employ an element configured to emit monochromatic light (light of a specific wavelength; for example, blue light) or white light (for example, light of a mixture of red light, green light, and blue light) in various directions by receiving power. For example, each light source 111 may include a light emitting diode (LED).

The PCB 112 may fix the plurality of light sources 111 to prevent a change in the position of the light source 111. Further, the PCB 112 may supply power, which is for the light source 111 to emit light, to the light source 111.

The PCB 112 may be provided with synthetic resin or tempered glass or a printed circuit board (PCB) that fixes the plurality of light sources 111 and on which a conductive power supply line for supplying power to the light source 111 is formed.

The reflective sheet 120 may reflect light emitted from the plurality of light sources 111 forward or in a direction close to the front.

In the reflective sheet 120, a plurality of through-holes 120a may be formed at positions corresponding to each of the plurality of light sources 111 of the light source module 110. In this manner, the light source 111 of the light source module 110 may pass through the through-hole 120a and protrude to the front of the reflective sheet 120.

For example, as shown in the upper portion of FIG. 5, in the process of assembling the reflective sheet 120 and the light source module 110, the plurality of light sources 111 of the light source module 110 may be inserted into the through-holes 120a formed on the reflective sheet 120. Accordingly, as shown in the lower portion of FIG. 5, the PCB 112 of the light source module 110 may be disposed at the rear of the reflective sheet 120, but the plurality of light sources 111 of the light source module 110 may be disposed in front of the reflective sheet 120.

Accordingly, the plurality of light sources 111 may emit light in front of the reflective sheet 120.

The plurality of light sources 111 may emit light in various directions in front of the reflective sheet 120. The light may be emitted not only toward the diffuser plate 130 from the light source 111, but also toward the reflective sheet 120 from the light source 111. The reflective sheet 120 may reflect light, which is emitted toward the reflective sheet 120, toward the diffuser plate 130.

Light emitted from the light source 111 may pass through various objects, such as the diffuser plate 130 and the optical sheet 140. Among incident light beams passing through the diffuser plate 130 and the optical sheet 140, some of the incident light beams may be reflected from the surfaces of the diffuser plate 130 and the optical sheet 140. The reflective sheet 120 may reflect light reflected by the diffuser plate 130 and the optical sheet 140.

The diffuser plate 130 may be provided in front of the light source module 110 and the reflective sheet 120, and may evenly distribute the light emitted from the light source 111 of the light source module 110. As described above, the plurality of light sources 111 may be disposed in various positions on the rear surface of the light source apparatus 100. However, even when the plurality of light sources 111 is disposed at equal intervals on the rear surface of the light source apparatus 100, unevenness in luminance may occur depending on the position of the plurality of light sources 111. Within the diffuser plate 130, the diffuser plate 130 may diffuse light emitted from the plurality of light sources 111 to remove unevenness in luminance caused by the plurality of light sources 111. In other words, the diffuser plate 130 may uniformly emit uneven light of the plurality of light sources 111 to the front surface.

The optical sheet 140 may include various sheets for improving luminance and luminance uniformity. For example, the optical sheet 140 may include a diffusion sheet 141, a first prism sheet 142, a second prism sheet 143, and a reflective polarizing sheet 144.

The diffusion sheet 141 may diffuse light for the luminance uniformity. The light emitted from the light source 111 may be diffused by the diffuser plate 130 and may be diffused again by the diffusion sheet 141 included in the optical sheet 140.

The first and second prism sheets 142 and 143 may increase the luminance by condensing light diffused by the diffusion sheet 141. The first and second prism sheets 142 and 143 may include a prism pattern in the shape of a triangular prism, and the prism pattern, which is provided in plurality, may be disposed adjacent to each other to form a plurality of strips.

The reflective polarizing sheet 144 may be a type of polarizing film and may transmit some of the incident light beams and reflect others for improving the luminance. For example, the reflective polarizing sheet 144 may transmit polarized light in the same direction as a predetermined polarization direction of the reflective polarizing sheet 144, and may reflect polarized light in a direction different from the polarization direction of the reflective polarizing sheet 144. In addition, the light reflected by the reflective polarizing sheet 144 may be recycled inside the light source apparatus 100, and thus the luminance of the display apparatus 10 may be improved by the light recycling.

The optical sheet 140 is not limited to the sheet or film shown in FIG. 4, and may include additional or alternative various sheets, such as a protective sheet, or films, among others.

Figure 6:
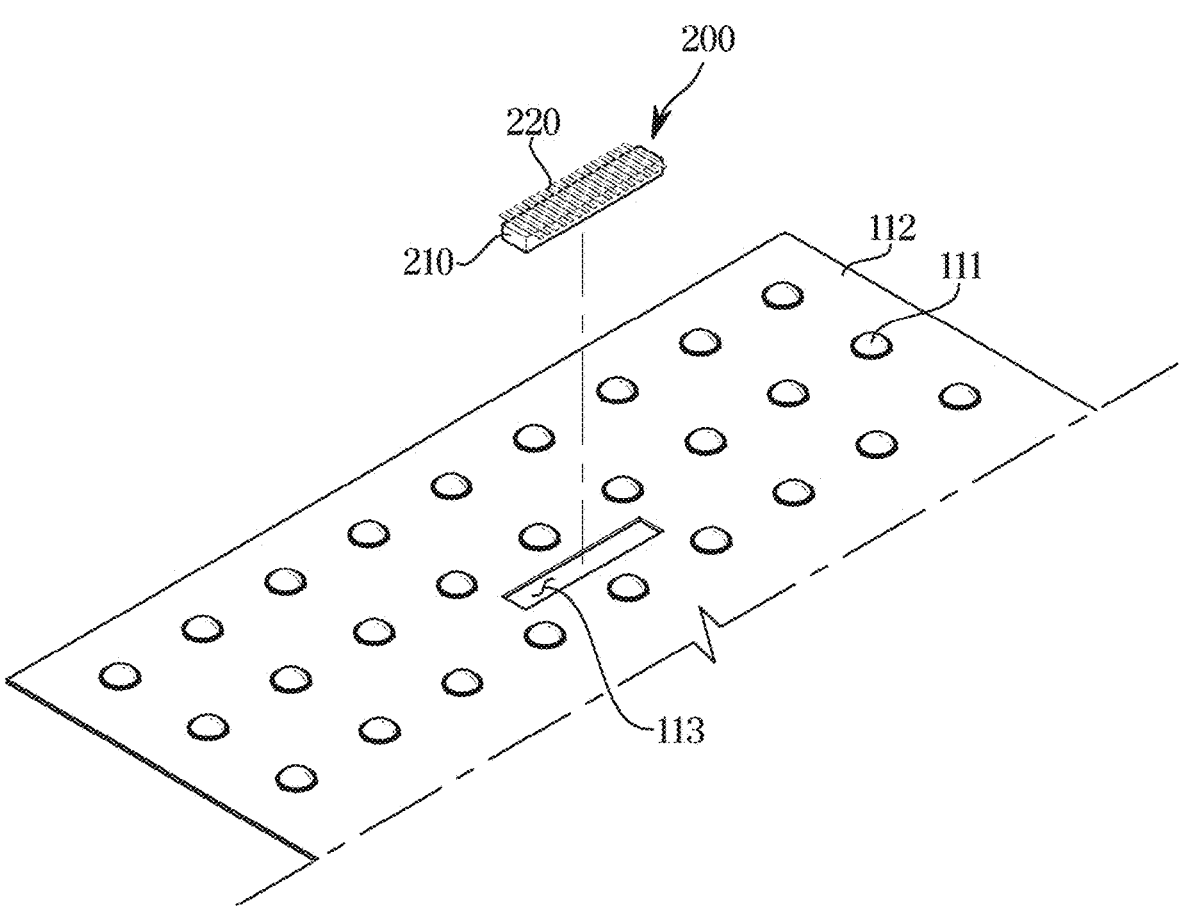
FIG. 6 is a view illustrating a state in which a connector is being mounted on an upper surface of a printed circuit board, according to an embodiment of the disclosure.
Figure 6:
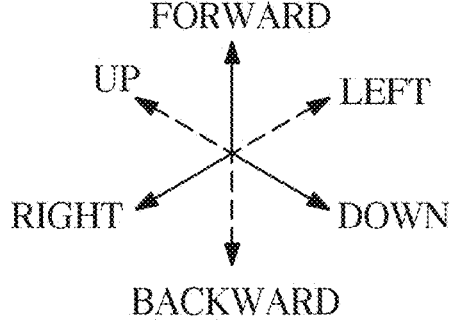
Figure 7:
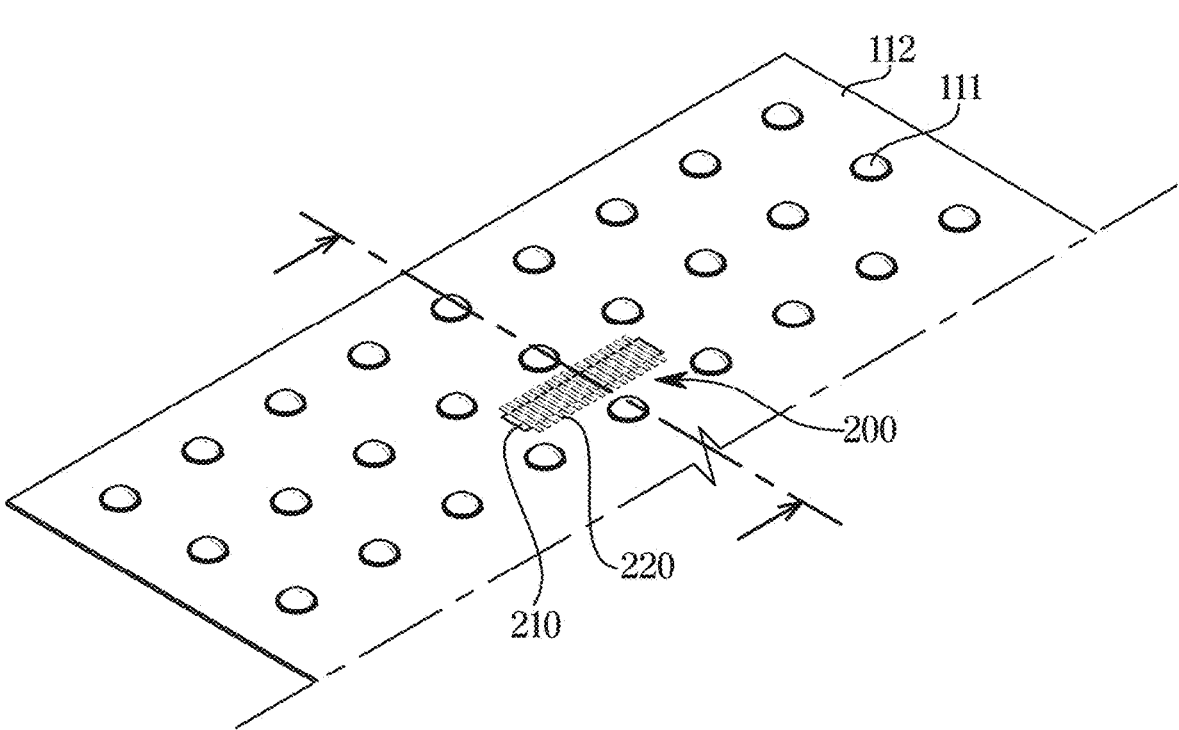
FIG. 7 is a view illustrating a state in which the connector is mounted on the upper surface of the printed circuit board, according to an embodiment of the disclosure.
Figure 7:
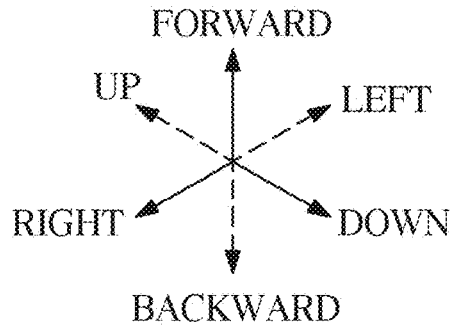
Figure 8:
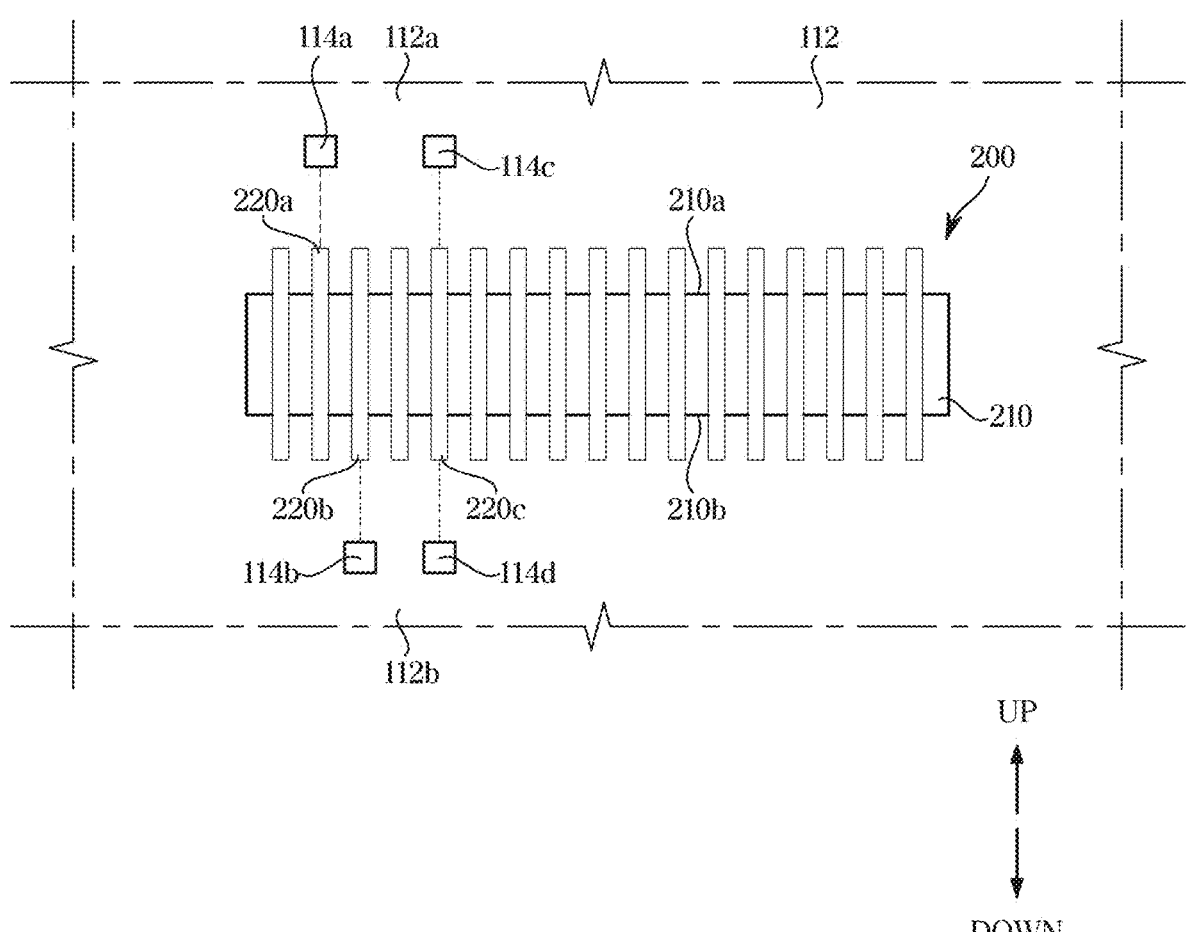
FIG. 8 is a top view schematically illustrating connections of a connector and a plurality of terminals formed on the upper surface of the printed circuit board, according to an embodiment of the disclosure.
Figure 9:
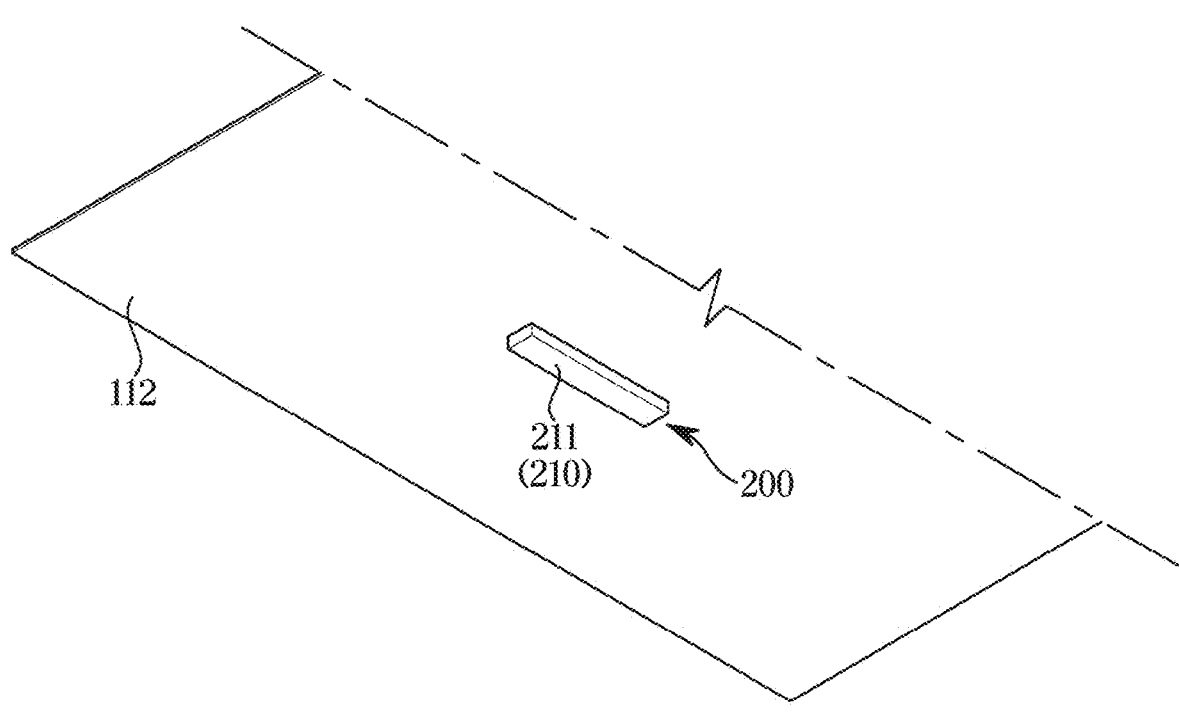
FIG. 9 is a view illustrating a state in which a lower portion of a connector protrudes to and past a lower surface of the printed circuit board, according to an embodiment of the disclosure.
Figure 9:
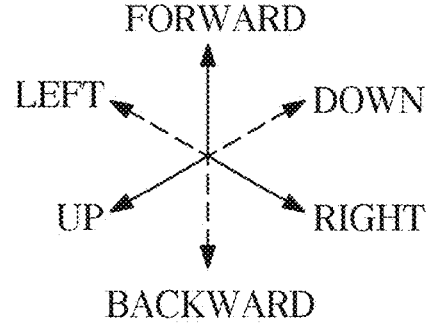
Figure 10:
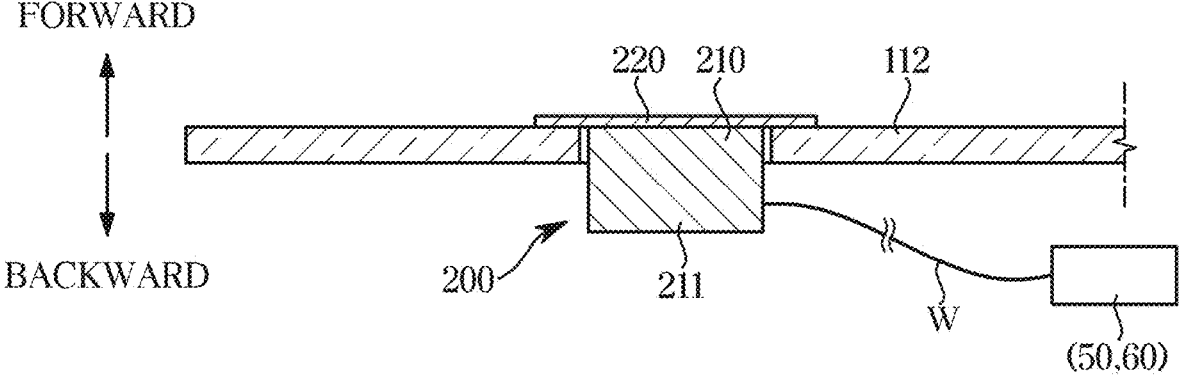
FIG. 10 is a cross-sectional view schematically illustrating a state in which a connector is mounted on the upper surface of the printed circuit board, according to an embodiment of the disclosure.

FIG. 6 is a view illustrating a state in which a connector is being mounted on an upper surface of a printed circuit board, according to an embodiment of the disclosure. FIG. 7 is a view illustrating a state in which the connector is mounted on the upper surface of the printed circuit board, according to an embodiment of the disclosure. FIG. 8 is a top view schematically illustrating connections of the connector and a plurality of terminals formed on the upper surface of the printed circuit board, according to an embodiment of the disclosure. FIG. 9 is a view illustrating a state in which a lower portion of the connector according to an embodiment protrudes to and past the lower surface of the printed circuit board, according to an embodiment of the disclosure. FIG. 10 is a cross-sectional view, at the division indicated in FIG. 7, schematically illustrating a state in which the connector according to an embodiment is mounted on the upper surface of the printed circuit board, according to an embodiment of the disclosure.

As shown in the embodiments illustrated in FIGS. 6 to 10, a connector 200 may be mounted on the PCB 112. The connector 200 may be mounted on the upper surface of the PCB 112. A through-hole 113 may be formed in the PCB 112 to allow the connector 200 to be mounted on the upper surface of the PCB 112. The connector 200 may be mounted on the upper surface of the PCB 112 by being inserted into the through-hole 113 on the upper surface of the PCB 112.

The connector 200 may include a connector body 210 inserted in the through-hole 113 formed in the PCB 112. A part of the connector body 210 may protrude to the lower surface of the PCB 112 through the through-hole 113. That is, a lower portion of the connector body 210 may protrude to, and past, the lower surface of the PCB 112 through the through-hole 113. The connector body 210 may include a connecting member 211 protruding past the lower surface of the PCB 112 through the through-hole 113. The connector body 210 may define a first side surface 210a, and a second side surface 210b opposite the first side surface 210a, each of which faces an inner edge of the through-hole 113, and parallel to the upper surface of the PCB 112, upon insertion. As shown in the drawings, upon insertion of the connector body 210 in the through-hole 113, the first side surface 210a faces in the direction indicated "UP" and the second side surface 210b faces in the direction indicated "DOWN". However, this is not a requirement, and the first and second side surfaces 210a, 210b may each face in any pair of opposite directions parallel to the upper surface of the PCB 112.

At the rear of the PCB 112, referring back to FIG. 2, the bottom chassis 15 and the rear cover 16 may be provided, such that the PCB 112, along with the other elements of the light source apparatus 100, may be assembled thereto. The power assembly 60 configured to supply power to the plurality of light sources 111 may be provided on the rear cover 16. The control assembly 50 configured to control the operation of the plurality of light sources 111 may be provided on the rear cover 16. The connecting member 211 may be electrically connected to the control assembly 50 and the power assembly 60 through a wire W. Although not shown in the drawing, the connecting member 211 may be connected to other circuits other than the control assembly 50 and the power assembly 60 through the wire W. In addition, a separate accessory may be added for connection between the connecting member 211 and other circuits. Although the drawing shows that the connecting member 211 is electrically connected to the control assembly 50 and the power assembly 60 through the wire W, the disclosure is not limited thereto. That is, the connecting member 211 may be electrically connected to the control assembly 50 and the power assembly 60 through a flexible flat cable (FFC).

The connector 200 may include a plurality of connector terminals 220 mounted on the upper surface of the PCB 112, or otherwise disposed in proximity to the upper surface upon insertion. The plurality of connector terminals 220 may electrically connect the connector body 210 with first and second members 112a, 112b of the PCB 112, which are defined as portions of the PCB 112 respectively adjacent to the first and second side surfaces 210a, 210b of the connector body 210 upon insertion of the connector body 210 in the through-hole 113. Portions of the upper surface of the PCB 112 on the first and second members 112a, 112b may be respectively defined as first and second surface portions of the PCB 112. That is, upon insertion of the connector body 210 in the through-hole 113, the first surface portion is defined as the portion of the upper surface of the printed circuit board adjacent to the first side surface of the connector body, and the second surface portion is defined as the portion of the upper surface of the printed circuit board adjacent to the second side surface. As shown in the drawings, upon insertion of the connector body 210 in the through-hole 113, the first member 112a is a portion of the PCB 112 adjacent to the connector body 210 in the direction indicated "UP" from the connector body 210, and the second member 112b is a portion of the PCB 112 adjacent to the connector body 210 in the direction indicated "DOWN" from the connector body 210. However, this is not a requirement, and the first and second members 112a, 112b may be any portions of the PCB 112 which are respectively adjacent to the first and second side surfaces 210a, 210b.

In the example embodiment shown in FIG. 8, the plurality of connector terminals 220 may be electrically connected to a plurality of PCB terminals 114 extending from metal wires (not shown) provided on the PCB 112. Each PCB terminal 114 may be disposed on one of the first and second members 112a, 112b in proximity to one of the first side surface 210a and the second side surface 210b of the connector body 210.

The plurality of PCB terminals 114 may include a first PCB terminal 114a and a third PCB terminal 114c each provided on the first member 112a. The plurality of PCB terminals 114 may also include a second PCB terminal 114b and a fourth PCB terminal 114d each provided on the second member 112b.

As shown in FIG. 8, the plurality of connector terminals 220 may include a first connector terminal 220a electrically connecting the first member 112a of the PCB 112 to the connector body 210. More specifically, the first connector terminal 220*a* may electrically connect the connector body 210 to the first PCB terminal 114*a* provided on the first member 112*a* of the PCB 112.

As shown in FIG. 8, the plurality of connector terminals 220 may include a second connector terminal 220*b* electrically connecting the second member 112*b* of the PCB 112 to the connector body 210. More specifically, the second connector terminal 220*b* may electrically connect the connector body 210 to the second PCB terminal 114*b* provided on the second member 112*b* of the PCB 112.

As shown in FIG. 8, the plurality of connector terminals 220 may include a third connector terminal 220*c* electrically connecting the first member 112*a* of the PCB 112 to the second member 112*b* of the PCB 112. More specifically, the third connector terminal 220*c* may electrically connect the third PCB terminal 114*c* provided on the first member 112*a* of the PCB 112 to the fourth PCB terminal 114*d* provided on the second member 112*b* of the PCB 112.

An additional challenge in the related art is the length and complex arrangement of vias formed on a PCB to electrically connect all components. However, as described above, the plurality of connector terminals 220 may electrically connect the first member 112*a* of the PCB 112 adjacent to the first side surface 210*a* of the connector body 210 to the second member 112*b* of the PCB 112 adjacent to the second side surface 210*b* of the connector body 210. Accordingly, it is possible to simplify a circuit connection configuration and to remove or reduce a via that is formed on the PCB 112 for the electrical connection.

It is noted that it may be difficult to arrange the connecting member 211 on the lower portion of the connector body 210, as shown for example in the embodiment illustrated in FIGS. 9 and 10, due to a relatively small width of the through-hole 113 into which the connector body 210 is inserted.

Figure 11:
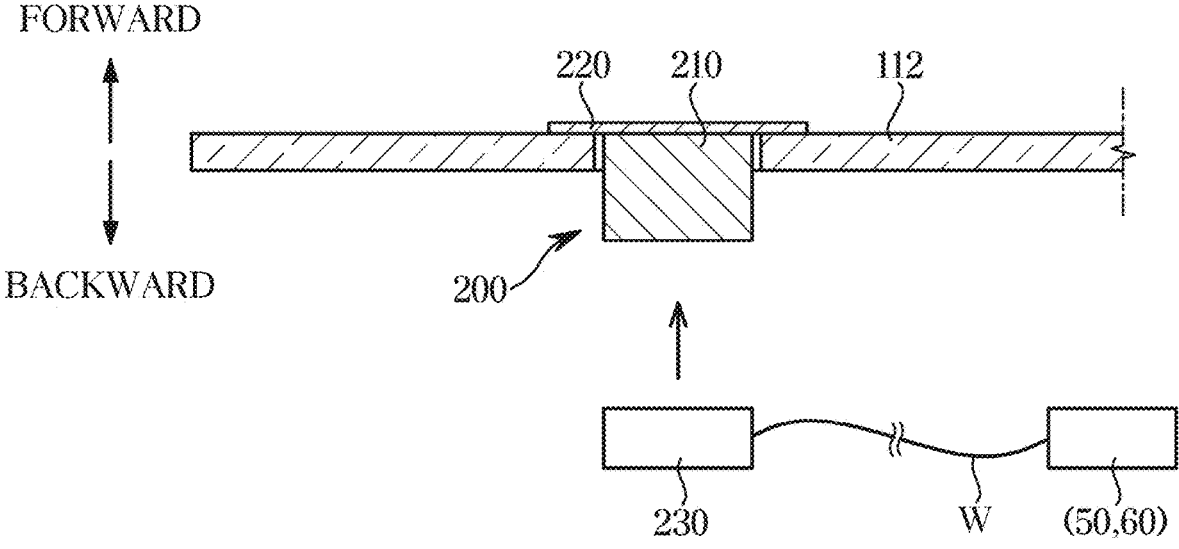
FIG. 11 is a cross-sectional view schematically illustrating a state in which an auxiliary connector connected to a wire is being assembled to a connector body of the connector, according to an embodiment of the disclosure.

FIG. 11 is a cross-sectional view schematically illustrating a state in which an auxiliary connector connected to a wire is being assembled to the connector body 210 of the connector 200, according to an embodiment of the disclosure.

Due to a relatively small width of the through-hole 113 into which the connector body 210 is inserted, it may be difficult to arrange the connecting member 211, as illustrated in FIGS. 9 and 10, in a desired position for the wire W. However, as shown in the embodiment illustrated in FIG. 11, an auxiliary connector 230 electrically connected to the control assembly 50 and the power assembly 60 through the wire W may be assembled, attached, or otherwise connected to the lower portion of the connector body 210. The auxiliary connector 230 may be detachably coupled to the lower portion of the connector body 210, or may be permanently coupled, as an assembly step of the display apparatus. The lower portion of the connector body 210 may be configured during manufacture to be detachably coupled or permanently coupled to the auxiliary connector 230. Through this coupling, the lower portion of the connector body 210 may be electrically commented to the auxiliary connector 230, and through the auxiliary connector 230 and the wire W to the control assembly 50 and the power assembly 60. As such, when the through-hole 113 has a relatively small width, it is possible to additionally couple the auxiliary connector 230 configured to serve as a connecting member to the lower portion of the connector body 210. Such arrangement avoids the aforementioned difficulties of arranging a connecting member 211.

As is apparent from the above description, a connector may be mounted on an upper surface of a printed circuit board and thus it is possible to reduce a process time and cost.

Further, a plurality of terminals may be mounted on an upper surface of a printed circuit board so as to electrically connect the printed circuit board in an upper portion of a connector to the printed circuit board in a lower portion of the connector. Therefore, it is possible to simplify a circuit connection configuration and to remove or reduce a via formed on the printed circuit board.

While embodiments of the connector and printed circuit board disclosed herein have been described in the context of a display apparatus, it is noted that embodiments of the connector and printed circuit board may be applied to and used in other systems using printed circuit boards. Such systems cover a wide range of electronic devices, and include but are not limited to telecommunications equipment, recording equipment, computing devices, and control systems for other hardware.

Although the connector, the display apparatus including the connector, and other components have been shown and described with specific shapes, positions, and orientations in the accompanying drawings, it would be appreciated by those skilled in the art that changes may be made in these embodiments without departing from the principles and spirit of the disclosure, the scope of which is defined in the claims and their equivalents.

What is claimed is:

1. A display apparatus comprising:

a display panel;

an outer case forming an exterior of the display apparatus;

a printed circuit board defining an upper surface, a lower surface opposite the upper surface, and a through-hole;

a plurality of light sources mounted on the upper surface of the printed circuit board and configured to emit light to the display panel; and a connector provided on the upper surface of the printed circuit board and inserted in the through-hole;

wherein the connector comprises:

a connector body inserted in the through-hole of the printed circuit board, the connector body defining a first side surface and a second side surface opposite to the first side surface; and a plurality of connector terminals disposed on the upper surface of the printed circuit board, the plurality of connector terminals being configured to electrically connect the connector body to a portion of the printed circuit board, wherein a first surface portion of the upper surface of the printed circuit board is defined adjacent to the first side surface of the connector body, a second surface portion of the upper surface of the printed circuit board is defined adjacent to the second side surface, and the plurality of connector terminals are configured to electrically connect the first surface portion of the printed circuit board to the second surface portion of the printed circuit board.

2. The display apparatus of claim 1, wherein the first surface portion of the upper surface of the printed circuit board is defined adjacent to the first side surface of the connector body, the second surface portion of the upper surface of the printed circuit board is defined adjacent to the second side surface, and the plurality of connector terminals comprises a first connector terminal configured to electrically connect the connector body to the first surface portion, and a second connector terminal configured to electrically connect the connector body to the second surface portion of the printed circuit board.

3. The display apparatus of claim 1, wherein the connector body further comprises a connecting member protruding past the lower surface of the printed circuit board through the through-hole.

4. The display apparatus of claim 3, further comprising:

a bottom chassis; and a rear cover adjacent to the lower surface of the printed circuit board, the printed circuit board being assembled on the rear cover.

5. The display apparatus of claim 4, further comprising:

a power assembly provided on the rear cover and configured to supply power to the plurality of light sources; and a control assembly provided on the rear cover and configured to control an operation of the plurality of light sources.

6. The display apparatus of claim 5, wherein the power assembly and the control assembly are electrically connected to the connecting member through a wire.

7. The display apparatus of claim 1, further comprising:

a power assembly configured to supply power to the plurality of light sources;

a control assembly configured to control an operation of the plurality of light sources; and an auxiliary connector detachably coupled to a lower portion of the connector body of the connector protruding past the lower surface of the printed circuit board through the through-hole, wherein the power assembly and the control assembly are electrically connected to the auxiliary connector through a wire to thereby electrically connect to the connector body.

\* \* \* \* \*